: US 9,024,283 B2
(45) Date of Patent: May 5, 2015

(12) United States Patent
Quick et al.

(54) HORIZONTALLY ORIENTED AND VERTICALLY STACKED MEMORY CELLS

(71) Applicant: Micron Technology, Inc., Boise, ID (US)

(72) Inventors: Timothy A. Quick, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 13/759,576

(22) Filed: Feb. 5, 2013

(65) Prior Publication Data

US 2013/0153853 A1    Jun. 20, 2013

Related U.S. Application Data

(62) Division of application No. 12/820,923, filed on Jun. 22, 2010, now Pat. No. 8,367,460.

(51) Int. Cl.
*H01L 29/02* (2006.01)
*H01L 45/00* (2006.01)
*H01L 27/24* (2006.01)

(52) U.S. Cl.
CPC .......... *H01L 45/1253* (2013.01); *H01L 27/249* (2013.01); *H01L 45/06* (2013.01); *H01L 45/1675* (2013.01); *H01L 45/04* (2013.01); *H01L 45/1226* (2013.01); *H01L 45/14* (2013.01); *H01L 45/144* (2013.01); *H01L 45/146* (2013.01); *H01L 45/147* (2013.01)

(58) Field of Classification Search
USPC .................. 438/102–104; 257/2–5, E29.002
See application file for complete search history.

(56) References Cited

U.S. PATENT DOCUMENTS

| | | | |
|---|---|---|---|
| 4,242,954 A | 1/1981 | McDaniel | |
| 4,247,893 A | 1/1981 | Anderson et al. | |
| 4,252,328 A | 2/1981 | Raj et al. | |
| 4,264,917 A | 4/1981 | Ugon | |
| RE30,671 E | 7/1981 | Poland | |
| 4,277,836 A | 7/1981 | Kawakami | |
| 4,290,843 A | 9/1981 | Korenstein | |
| 4,301,040 A | 11/1981 | Berbeco | |
| 4,301,503 A | 11/1981 | Frederiksen | |
| 4,302,939 A | 12/1981 | Golestaneh | |
| 4,312,898 A | 1/1982 | McDaniel | |
| 4,321,693 A | 3/1982 | Naden | |
| 4,325,217 A | 4/1982 | Golestaneh | |
| 4,331,089 A | 5/1982 | Widmer | |
| 4,332,257 A | 6/1982 | Ayer | |
| 4,335,809 A | 6/1982 | Wain | |
| 4,344,153 A | 8/1982 | Nishida et al. | |
| 4,352,334 A | 10/1982 | Childs et al. | |
| 4,352,957 A | 10/1982 | Ruether | |

(Continued)

*Primary Examiner* — Jami M Valentine

(74) *Attorney, Agent, or Firm* — Brooks, Cameron & Huebsch, PLLC

(57) ABSTRACT

Horizontally oriented and vertically stacked memory cells are described herein. One or more method embodiments include forming a vertical stack having a first insulator material, a first memory cell material on the first insulator material, a second insulator material on the first memory cell material, a second memory cell material on the second insulator material, and a third insulator material on the second memory cell material, forming an electrode adjacent a first side of the first memory cell material and a first side of the second memory cell material, and forming an electrode adjacent a second side of the first memory cell material and a second side of the second memory cell material.

19 Claims, 12 Drawing Sheets

(56) References Cited

U.S. PATENT DOCUMENTS

| | | | |
|---|---|---|---|
| 4,360,823 A | 11/1982 | van Gils | |
| 4,365,112 A | 12/1982 | Ruether | |
| RE31,208 E | 4/1983 | Watanabe | |
| 4,384,349 A | 5/1983 | McElroy | |
| 4,394,741 A | 7/1983 | Lowndes | |
| 4,420,767 A | 12/1983 | Hodge et al. | |
| 4,423,596 A | 1/1984 | Karnes et al. | |
| 4,433,278 A | 2/1984 | Lowndes | |
| 4,433,389 A | 2/1984 | York et al. | |
| 4,434,618 A | 3/1984 | Dillon | |
| 4,444,702 A | 4/1984 | Thomas et al. | |
| 4,455,742 A | 6/1984 | Williams et al. | |
| 4,464,425 A | 8/1984 | Voigt et al. | |
| 4,472,939 A | 9/1984 | Wang | |
| 4,485,948 A | 12/1984 | Cook | |
| 4,501,124 A | 2/1985 | Shone et al. | |
| 4,517,492 A | 5/1985 | Byrum, Jr. et al. | |
| 4,542,960 A | 9/1985 | Yang | |
| 4,544,443 A | 10/1985 | Ohta et al. | |
| 4,554,027 A | 11/1985 | Tautzenberger et al. | |
| 4,586,980 A | 5/1986 | Hirai et al. | |
| 4,605,926 A | 8/1986 | Onishi et al. | |
| 4,615,849 A | 10/1986 | Hahn | |
| 4,619,034 A | 10/1986 | Janning | |
| 4,621,261 A | 11/1986 | Hehlen et al. | |
| 4,675,715 A | 6/1987 | Lepselter et al. | |
| 4,901,230 A | 2/1990 | Chen et al. | |
| 4,924,427 A | 5/1990 | Savage et al. | |
| 4,953,102 A | 8/1990 | Kimura et al. | |
| 5,016,165 A | 5/1991 | Tanikawa et al. | |
| 5,020,003 A | 5/1991 | Moshenberg | |
| 5,232,876 A | 8/1993 | Kim et al. | |
| 5,300,808 A | 4/1994 | Suppelsa et al. | |
| 5,332,696 A | 7/1994 | Kim et al. | |
| 5,334,862 A | 8/1994 | Manning et al. | |
| 5,383,413 A | 1/1995 | Hayashi | |
| 5,416,916 A | 5/1995 | Bayle | |
| 5,506,953 A | 4/1996 | Dao | |
| 5,506,993 A | 4/1996 | Fitch et al. | |
| 5,543,678 A | 8/1996 | Hoiberg | |
| 5,559,969 A | 9/1996 | Jennings | |
| 5,563,945 A | 10/1996 | Gercekci | |
| 5,566,106 A | 10/1996 | Bergemont | |
| 5,592,546 A | 1/1997 | Takahashi | |
| 5,608,892 A | 3/1997 | Wakerly | |
| 5,617,529 A | 4/1997 | Dao | |
| 5,764,918 A | 6/1998 | Poulter | |
| 5,765,740 A | 6/1998 | Ferguson | |
| 5,768,445 A | 6/1998 | Troeller et al. | |
| 5,810,053 A | 9/1998 | Mandich | |
| 5,815,727 A | 9/1998 | Motomura | |
| 5,827,322 A | 10/1998 | Williams | |
| 5,860,112 A | 1/1999 | Langendorf et al. | |
| 5,861,116 A | 1/1999 | Mandich | |
| 5,875,466 A | 2/1999 | Wakerly | |
| 5,912,453 A | 6/1999 | Gungl et al. | |
| 5,929,634 A | 7/1999 | Artinger | |
| 5,940,860 A | 8/1999 | Hagersten et al. | |
| 5,943,517 A | 8/1999 | Sato | |
| 5,956,344 A | 9/1999 | Cole | |
| 5,968,192 A | 10/1999 | Kornachuk et al. | |
| 5,978,307 A | 11/1999 | Proebsting et al. | |
| 5,982,700 A | 11/1999 | Proebsting | |
| 5,986,922 A | 11/1999 | Perumal | |
| 5,997,465 A | 12/1999 | Savage et al. | |
| 5,999,478 A | 12/1999 | Proebsting | |
| 6,003,112 A | 12/1999 | Tetrick | |
| 6,033,412 A | 3/2000 | Losken et al. | |
| 6,044,481 A | 3/2000 | Kornachuk et al. | |
| 6,072,795 A | 6/2000 | Poulter | |
| 6,078,971 A | 6/2000 | Tsutsumi | |
| 6,085,296 A | 7/2000 | Karkhanis et al. | |
| 6,095,323 A | 8/2000 | Ferguson | |
| 6,173,425 B1 | 1/2001 | Knaack | |
| 6,177,315 B1 | 1/2001 | Bergemont et al. | |
| 6,218,227 B1 | 4/2001 | Park et al. | |
| 6,222,562 B1 | 4/2001 | Leidich | |
| 6,248,635 B1 | 6/2001 | Foote et al. | |
| 6,839,263 B2 * | 1/2005 | Fricke et al. | 365/63 |
| 7,006,370 B1 | 2/2006 | Ramesh et al. | |
| 7,038,230 B2 | 5/2006 | Chen et al. | |
| 7,075,131 B2 | 7/2006 | Chen | |
| 7,199,008 B2 | 4/2007 | Tseng | |
| 7,259,023 B2 | 8/2007 | Kuo et al. | |
| 7,442,602 B2 | 10/2008 | Park et al. | |
| 7,646,664 B2 | 1/2010 | Cho et al. | |
| 7,671,395 B2 | 3/2010 | Park et al. | |
| 2004/0114413 A1 * | 6/2004 | Parkinson et al. | 365/100 |
| 2004/0151024 A1 * | 8/2004 | Fricke et al. | 365/177 |
| 2005/0145984 A1 | 7/2005 | Chen et al. | |
| 2006/0054991 A1 | 3/2006 | Kuo et al. | |
| 2006/0157681 A1 | 7/2006 | Chen et al. | |
| 2006/0284237 A1 | 12/2006 | Park et al. | |
| 2007/0161186 A1 | 7/2007 | Ho | |
| 2007/0259479 A1 | 11/2007 | Kuo et al. | |
| 2007/0278529 A1 | 12/2007 | Lai et al. | |
| 2007/0285962 A1 | 12/2007 | Yen et al. | |
| 2008/0035905 A1 | 2/2008 | Parkinson | |
| 2008/0042118 A1 | 2/2008 | Hayakawa | |
| 2008/0048213 A1 | 2/2008 | Liu | |
| 2008/0116441 A1 | 5/2008 | Raghuram et al. | |
| 2008/0119007 A1 | 5/2008 | Raghuram et al. | |
| 2009/0026439 A1 | 1/2009 | Park et al. | |
| 2009/0027955 A1 * | 1/2009 | Koh et al. | 365/163 |
| 2009/0108470 A1 * | 4/2009 | Okada et al. | 257/777 |
| 2009/0267044 A1 | 10/2009 | Chang | |
| 2010/0006814 A1 | 1/2010 | Chen et al. | |
| 2010/0009522 A1 | 1/2010 | Parkinson | |
| 2010/0012918 A1 | 1/2010 | Parkinson | |
| 2011/0241077 A1 * | 10/2011 | Lung | 257/208 |

* cited by examiner

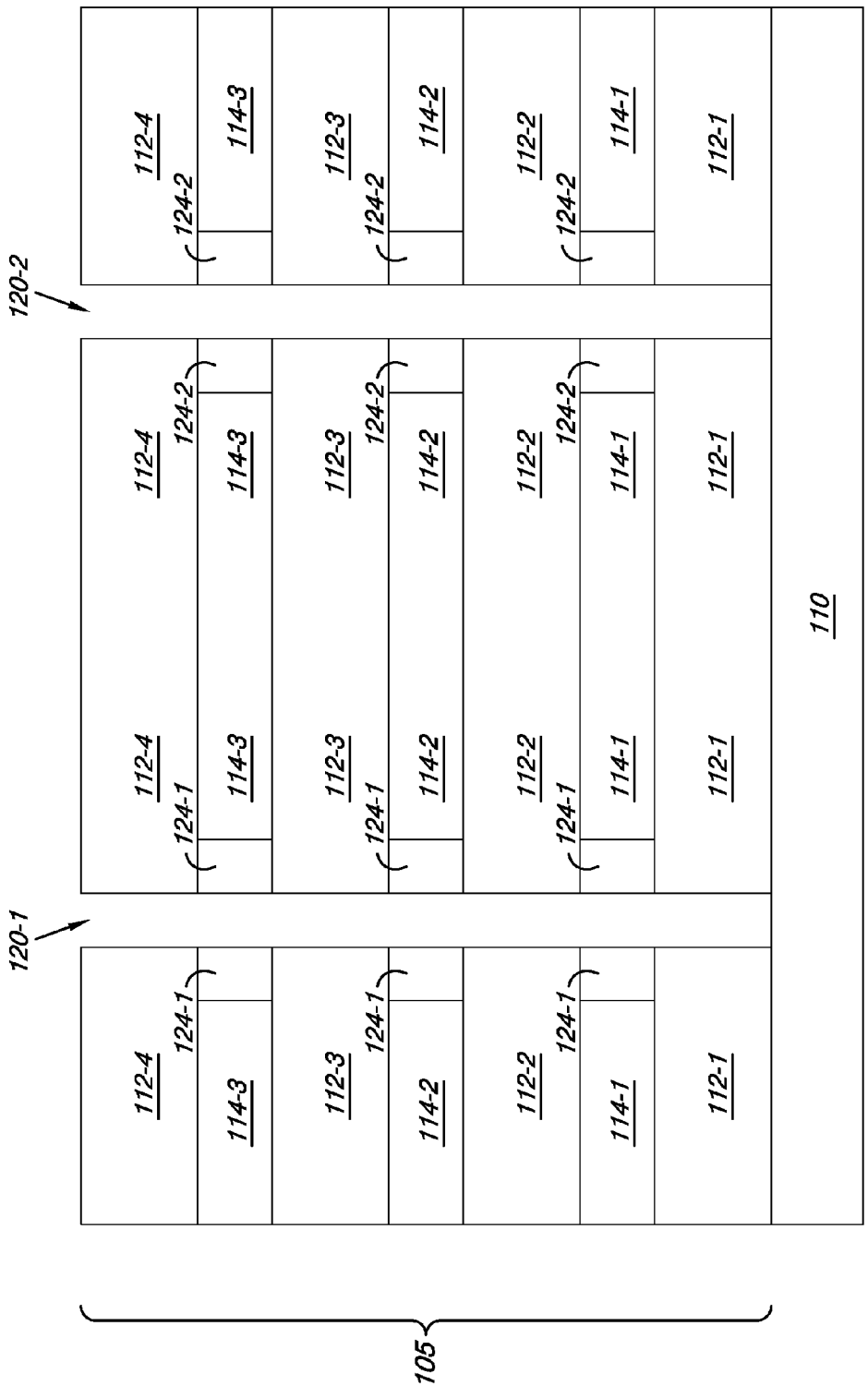

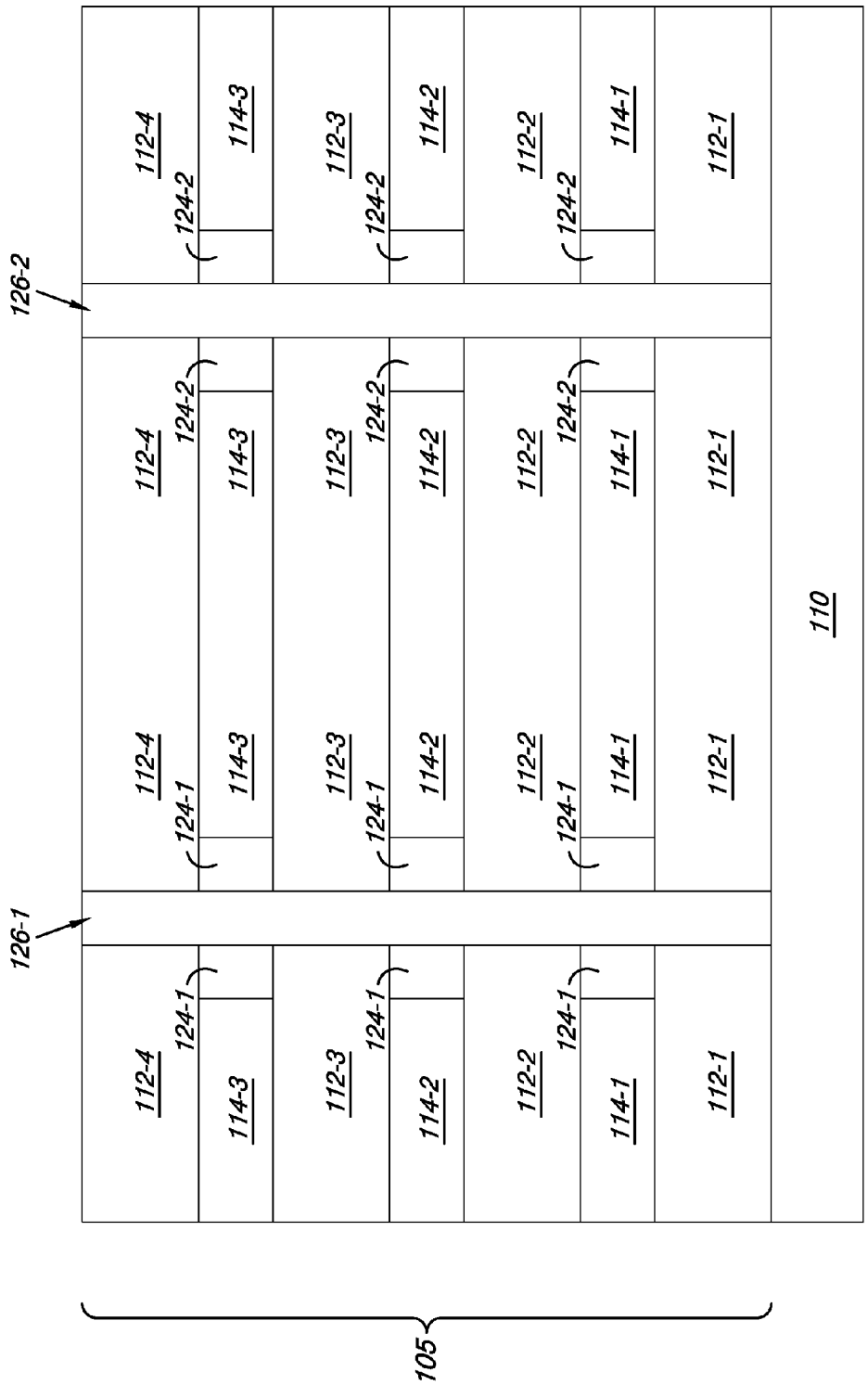

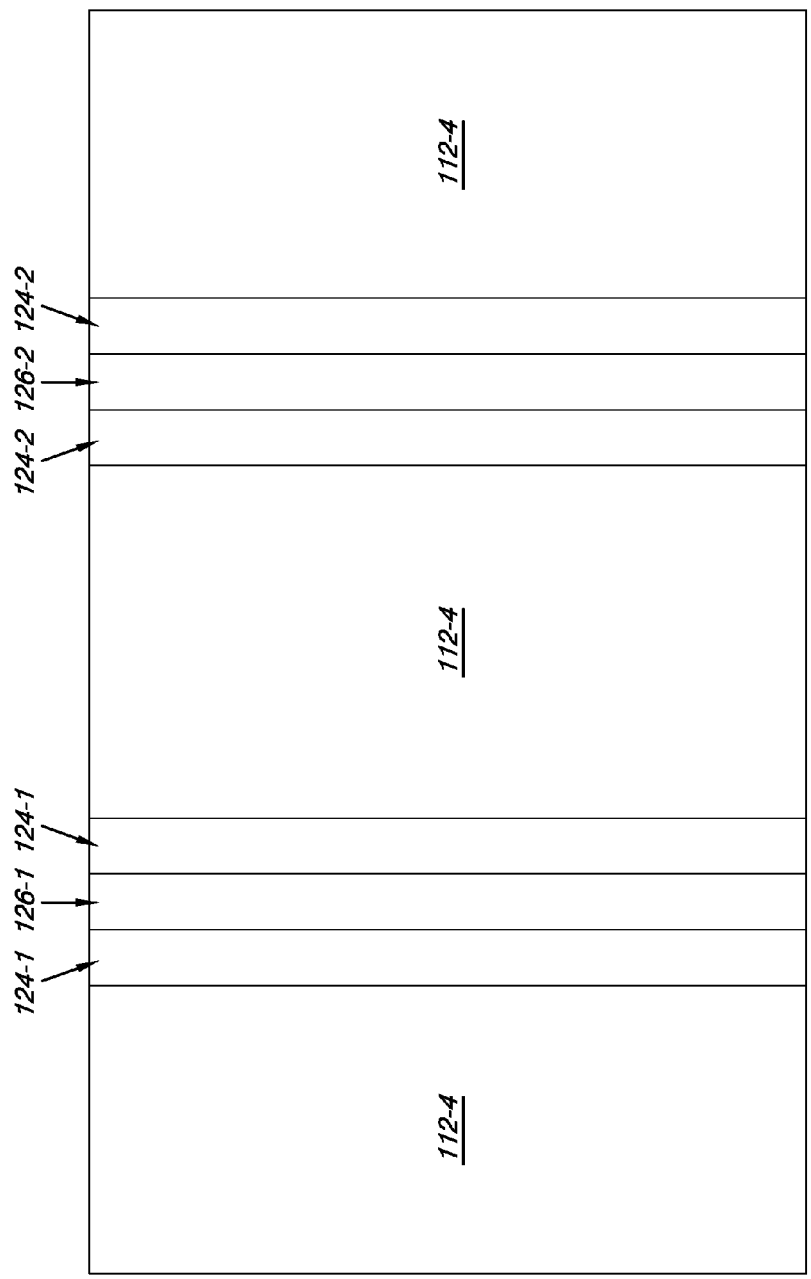

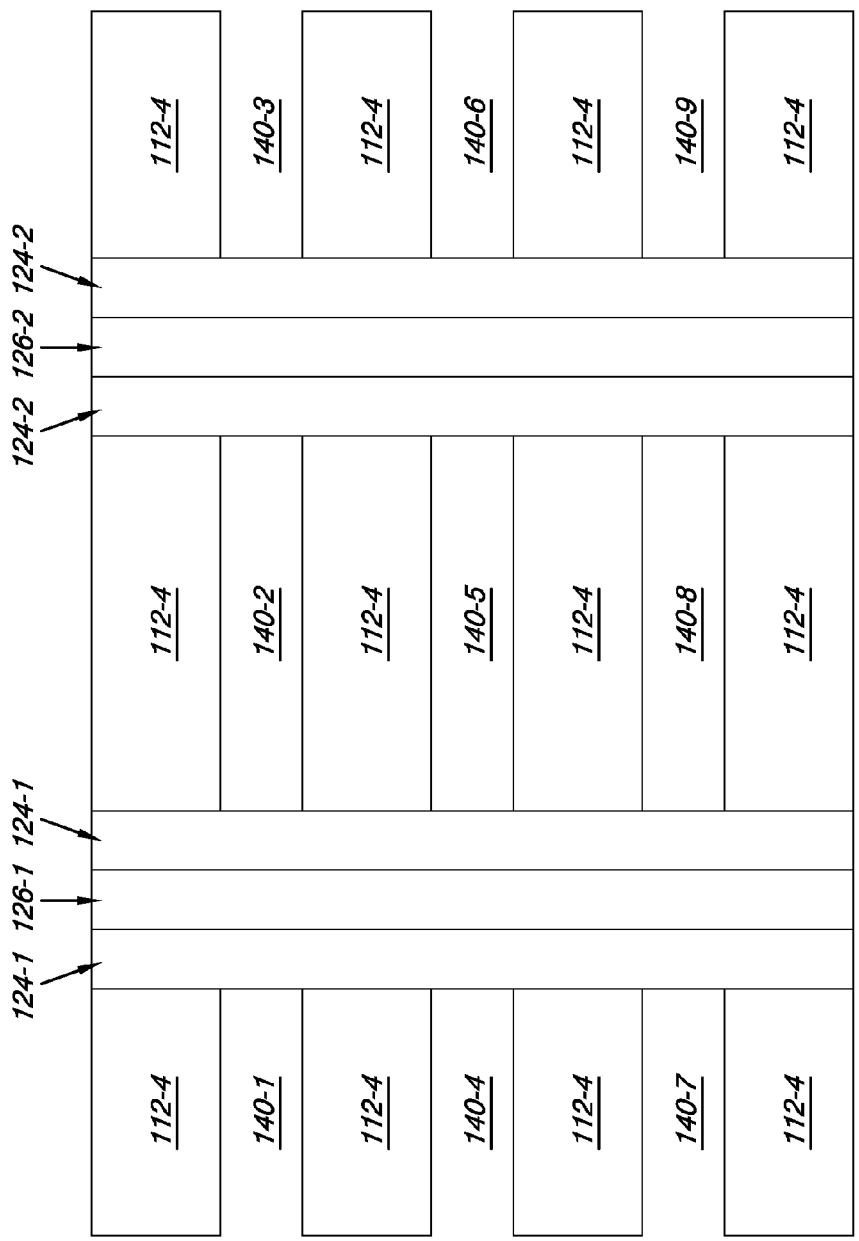

*Fig. 1I*

HORIZONTALLY ORIENTED AND VERTICALLY STACKED MEMORY CELLS

PRIORITY APPLICATION INFORMATION

This application is a Divisional of U.S. application Ser. No. 12/820,923, filed Jun. 22, 2010, issued as U.S. Pat. No. 8,367,460 on Feb. 5, 2013, the specification of which is incorporated herein by reference.

TECHNICAL FIELD

The present disclosure relates generally to semiconductor memory devices, methods, and systems, and more particularly, to horizontally oriented and vertically stacked memory cells.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive, e.g., resistance variable, memory, among others. Types of resistive memory include programmable conductor memory, resistive random access memory (RRAM), and phase change random access memory (PCRAM), among others.

Memory devices such as resistive memory devices may be utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices such as resistive memory devices may include a number of memory cells, e.g., resistive memory cells, arranged in an array. For example, an access device, such as a diode, a field effect transistor (FET), or bipolar junction transistor (BJT), of the memory cells may be coupled to an access line, e.g., word line, forming a "row" of the array. The memory cell material, e.g., memory element, of each memory cell may be coupled to a data line, e.g., bit line, in a "column" of the array. In this manner, the access device of a memory cell may be accessed through a row decoder activating a row of memory cells by selecting the word line coupled to their gates. The programmed state of a particular memory cell in a row of selected memory cells may be determined, e.g., sensed, by causing different currents to flow in the memory elements depending on the resistance associated with a programmed state for the particular memory cell.

Memory cells such as resistive memory cells may be programmed, e.g., written, to a desired state. That is, one of a number of programmed states, e.g., resistance levels, can be set for a memory cell. For example, a single level cell (SLC) can represent one of two logic states, e.g., 1 or 0. Memory cells can also be programmed to one of more than two programmed states, such as to represent more than two binary digits, e.g., 1111, 0111, 0011, 1011, 1001, 0001, 0101, 1101, 1100, 0100, 0000, 1000, 1010, 0010, 0110, or 1110. Such cells may be referred to as multi state memory cells, multi-digit cells, or multilevel cells (MLCs).

Resistive memory cells such as RRAM cells and PCRAM cells may store data by varying the resistance level of a resistive memory cell material, e.g., resistive memory element. For example, data may be programmed to a selected RRAM cell by applying sources of energy, such as positive or negative electrical pulses, e.g., positive or negative voltage or current pulses, to a particular RRAM cell material for a predetermined duration. RRAM cells may be programmed to a number of resistance levels by application of voltages or currents of various magnitudes, polarities, and durations.

The resistive memory cell material of a PCRAM cell may be a phase change material, such as Germanium-Antimony-Telluride (GST). The phase change material may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This may result in the PCRAM cell being programmed to a particular resistance state, which may correspond to a data state. In a binary system, for example, the amorphous, higher resistance state may correspond to a data state of 1, and the crystalline, lower resistance state may correspond to a data state of 0. However, the choice of these corresponding data states may be reversed, that is, in other binary systems, the amorphous, higher resistance state may correspond to a data state of 0, and the crystalline, lower resistance state may correspond to a data state of 1.

In previous approaches, resistive memory cells, such as RRAM cells and PCRAM cells, in a resistive memory device may be horizontally oriented, e.g., the electrodes of the cells may be located adjacent the sides of the cells. Additionally, in previous approaches, resistive memory cells in resistive memory devices may be vertically stacked, e.g., a first cell may be stacked on top of a second cell. However, in previous approaches, horizontally oriented resistive memory cells may not be also be vertically stacked, and vice versa. That is, a memory device processed in accordance with previous approaches may have only horizontally oriented memory cells or only vertically stacked memory cells, but may not have memory cells that are both horizontally oriented and vertically stacked. Memory devices having only horizontally oriented memory cells or only vertically stacked memory cells may have a large size, e.g., area, and/or a low density.

BRIEF DESCRIPTION OF THE DRAWINGS

FIGS. 1A-1L illustrate process steps associated with forming a memory device in accordance with one or more embodiments of the present disclosure.

DETAILED DESCRIPTION

Figure 1A:
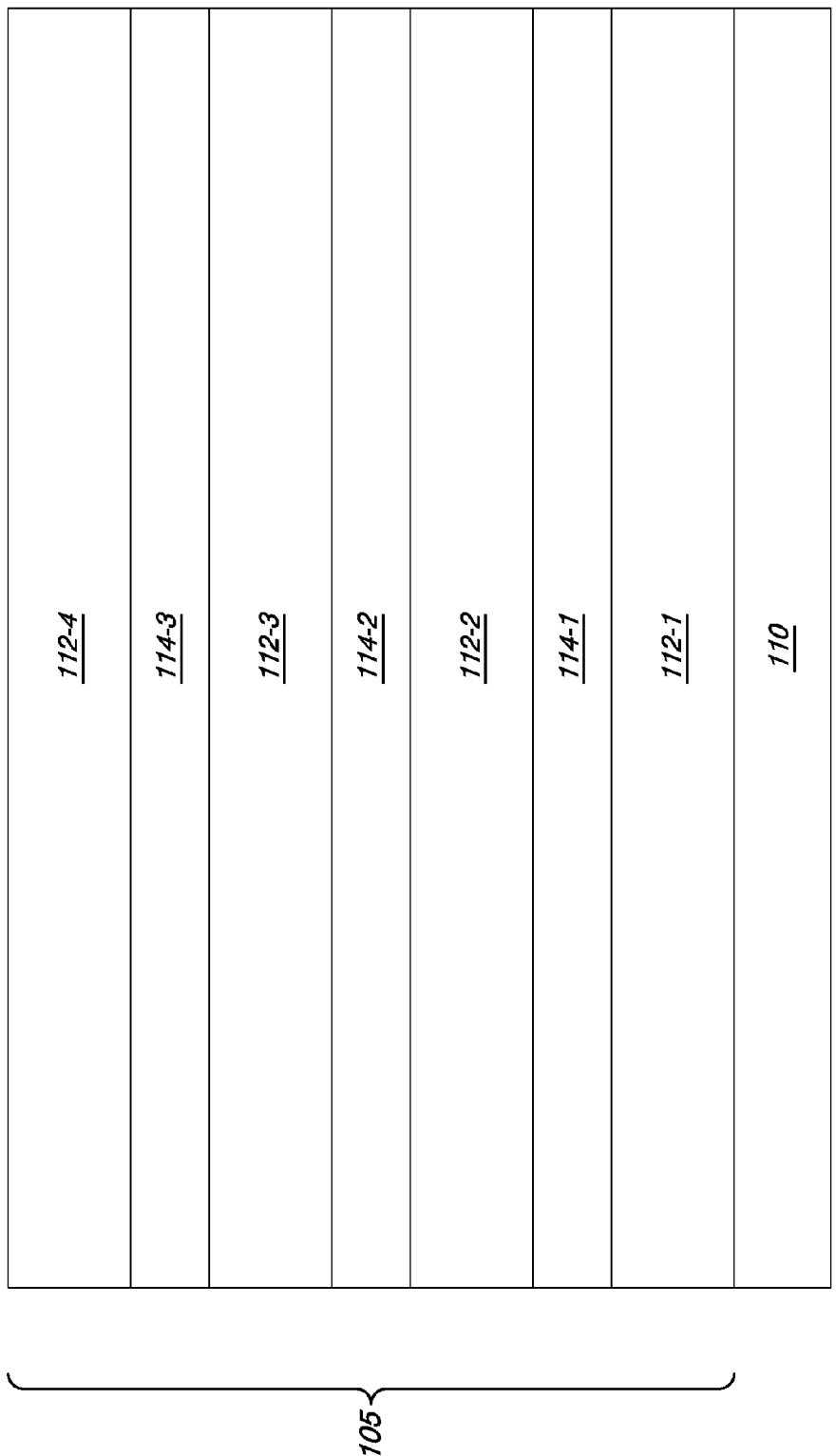

Horizontally oriented and vertically stacked memory cells are described herein. One or more method embodiments include forming a vertical stack having a first insulator material, a first memory cell material on the first insulator material, a second insulator material on the first memory cell material, a second memory cell material on the second insulator material, and a third insulator material on the second memory cell material, forming an electrode adjacent a first side of the first memory cell material and a first side of the second memory cell material, and forming an electrode adjacent a second side of the first memory cell material and a second side of the second memory cell material.

One or more embodiments of the present disclosure can include memory devices, e.g., resistive memory devices, having memory cells that are both horizontally oriented and vertically stacked. Additionally, one or more embodiments of the present disclosure can be used to process memory devices, e.g., resistive memory devices, having memory cells that are both horizontally oriented and vertically stacked. Memory devices having memory cells that are both horizontally oriented and vertically stacked can have a decreased size, e.g., area, and/or an increased density.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice a number of embodiments of this disclosure, and it is to be understood that other embodiments may be utilized and that process, electrical, or mechanical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 105 may reference element "05" in FIG. 1, and a similar element may be referenced as 205 in FIG. 2.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

As used herein, "a number of" something can refer to one or more such things. For example, a number of memory devices can refer to one or more memory devices.

FIGS. 1A-1L illustrate process steps associated with forming a memory device in accordance with embodiments of the present disclosure. FIG. 1A illustrates a schematic cross-sectional view of a vertical stack 105 formed, e.g., deposited, on an access device 110.

As shown in FIG. 1A, vertical stack 105 includes a first insulator material 112-1 formed, e.g., deposited, on access device 110, a first memory cell material 114-1 formed on first insulator material 112-1, a second insulator material 112-2 formed on first memory cell material 114-1, a second memory cell material 114-2 formed on second insulator material 112-2, a third insulator material 112-3 formed on second memory cell material 114-2, a third memory cell material 114-3 formed on third insulator material 114-2, and a fourth insulator material 112-4 formed on third memory cell material 114-2. The thickness, e.g., distance from bottom to top, of each insulator material 112-1, 112-2, 112-3, and 112-4 can be, for example, 50 nanometers, and the thickness of each memory cell material 114-1, 114-2, and 114-3 can be, for example, 2 nanometers. However, embodiments of the present disclosure are not limited to a particular thickness. Additionally, embodiments of the present disclosure are not limited to a particular number of insulator materials and memory cell materials, e.g., vertical stack 105 can include more or fewer insulator materials and memory cell materials than shown in FIG. 1A.

Vertical stack 105 can be formed on access device 110 in situ or ex situ using physical vapor deposition (PVD), for example. In embodiments in which vertical stack 105 is formed on access device 110 in situ, insulator materials 112-1 through 112-4 and memory cell materials 114-1 through 114-3 can be formed in a sealed environment, e.g., chamber, using PVD. For example, insulator material 112-1 can be deposited on access device 110 in a sealed environment using PVD. Memory cell material 114-1 can then be deposited on insulator material 112-1 in the same sealed environment without breaking the seal, e.g., vacuum, of the environment using PVD. Insulator material 112-2 can then be deposited on memory cell material 114-1, memory cell material 114-2 can then be deposited on insulator material 112-2, insulator material 112-3 can then be deposited on memory cell material 114-2, memory cell material 114-3 can then be deposited on insulator material 112-3, and insulator material 112-4 can then be deposited on memory cell material 114-3, all in the same sealed environment without breaking the seal of the environment using PVD. In embodiments in which vertical stack 105 is formed on access device 110 ex situ, insulator materials 112-1 through 112-4 and memory cell materials 114-1 through 114-3 can be formed in an unsealed environment using PVD.

Embodiments of the present disclosure are not limited to a particular type of deposition process for forming vertical stack 105. However, using PVD to form vertical stack 105 can form memory cell materials, e.g., memory cell materials 114-1 through 114-3, having the thickness previously described herein more efficiently, e.g., more cheaply, in less time, and/or using fewer materials, than other deposition processes, such as chemical vapor deposition (CVD), atomic layer deposition (ALD), and/or conformal deposition processes.

Access device 110 can be, for example, a transistor, such as a field effect transistor (FET) or bipolar junction transistor (BJT), or a diode, among other types of access devices. An example of an FET as an access device will be further described herein in connection with FIG. 2. However, embodiments of the present disclosure are not limited to a particular type of access device.

Insulator materials 112-1 through 112-4 can be, for example, a dielectric material. Dielectric materials can include, for example, nitride dielectric materials, such as silicon nitride ($Si_3N_4$) dielectric materials, and oxide dielectric materials, such as silicon dioxide ($SiO_2$) dielectric materials. However, embodiments of the present disclosure are not limited to a particular type of insulator material.

Memory cell materials 114-1 through 114-3 can be, for example, a two-terminal resistive memory cell material, such as a phase change (PC) material or resistive random access memory (RRAM) cell material. PC materials can include, for example, phase change chalcogenide alloys such as Germanium-Antimony-Tellurium (GST) materials, e.g., Ge—Sb—Te materials such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other PC materials can include, for example, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other PC materials. However, embodiments of the present disclosure are not limited to a particular type of PC material.

RRAM cell materials can include, for example, $Ge_xSe_y$, a binary metal oxide such as $Cu_xO_y$, $WO_x$, $Nb_2O_5$, $Al_2O_3$, $Ta_2O_5$, $TiO_x$, $ZrO_x$, $Ni_xO$, and $Fe_xO$, and/or other materials that can support solid phase electrolyte behavior. Other RRAM cell materials can include perovskite oxides such as doped or undoped $SrTiO_3$, $SrZrO_3$, and $BaTiO_3$, colossal magnetoresistive materials such as $Pr_{(1-x)}Ca_xMnO_3$ (PCMO), $La_{(1-x)}Ca_xMnO_3$ (LCMO), and $Ba_{(1-x)}Sr_xTiO_3$, and polymer materials such as Bengala Rose, $AlQ_3Ag$, Cu-TCNQ, DDQ, TAPA, and Fluorescine-based polymers, among other types of RRAM cell materials. Embodiments of the present disclosure are not limited to a particular type of RRAM cell material.

Figure 1B:
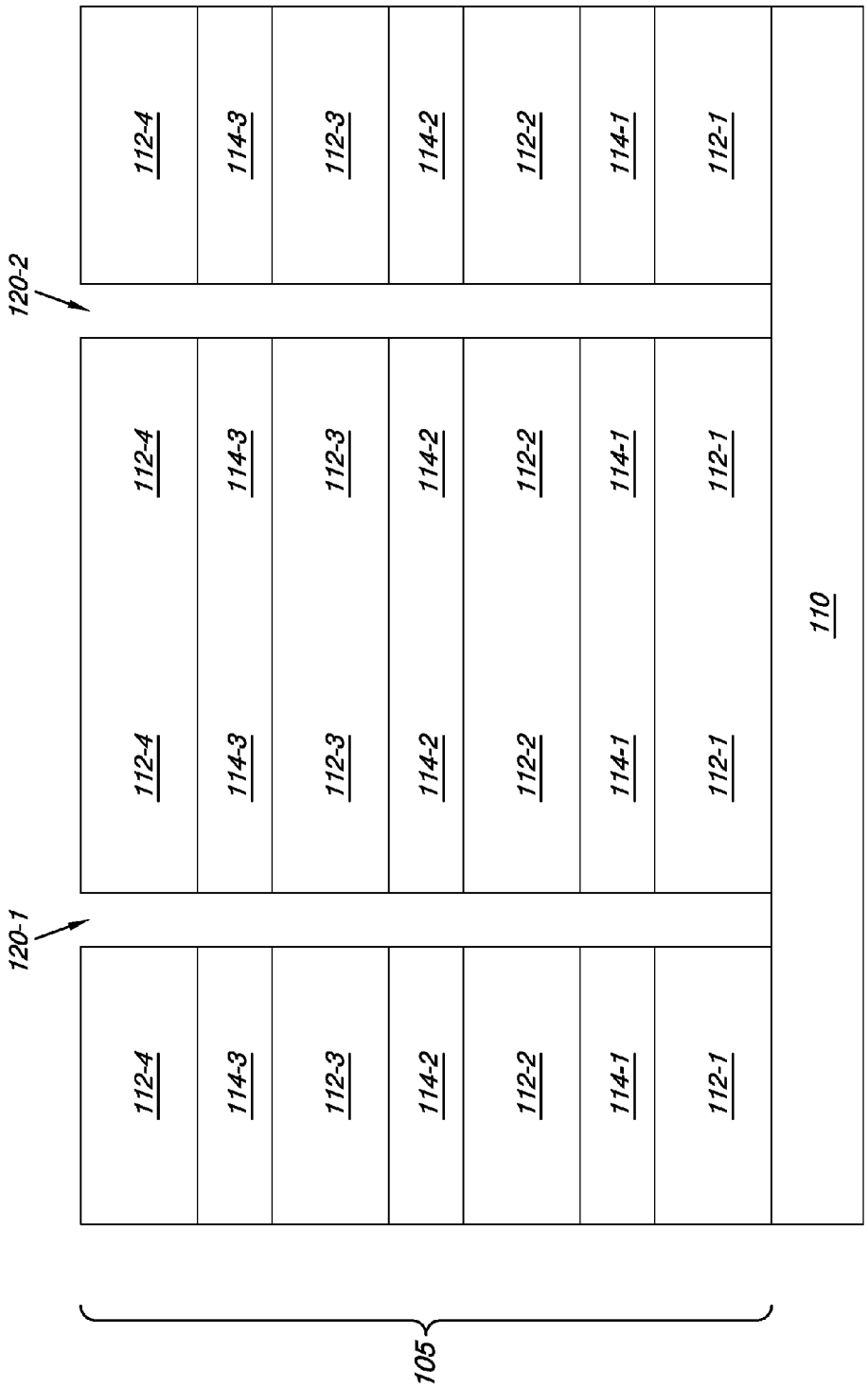

FIG. 1B illustrates a schematic cross-sectional view of the structure shown in FIG. 1A after a subsequent processing step. Portions of vertical stack 105 are removed, e.g., etched and/or patterned, to form openings 120-1 and 120-2 in vertical stack 105 shown in FIG. 1B. As shown in FIG. 1B, one or more sides of insulator materials 112-1 through 112-4 and memory cell materials 114-1 through 114-3 can be adjacent openings 120-1 and 120-2.

Openings 120-1 and 120-2 can be formed in vertical stack 105 in a number of ways. For example, openings 120-1 and 120-2 can be formed by etching through vertical stack 105, e.g., through insulator material 112-4, memory cell material 114-3, insulator material 112-3, memory cell material 114-2, insulator material 112-2, memory cell material 114-1, and insulator material 112-1, to access device 110 such that the bottom of openings 120-1 and 120-2 are adjacent access device 110, as shown in FIG. 1B. Further, openings 120-1 and 120-2 can be formed in a single etch through vertical stack 105. Alternatively, openings 120-1 and 120-2 can be formed in a series of etches through vertical stack 105, e.g., a first etch that removes a portion of insulator material 112-4, a second, subsequent etch that removes a portion of memory cell material 114-3, a third, subsequent etch that removes a portion of insulator material 112-3, etc.

Figure 1C:
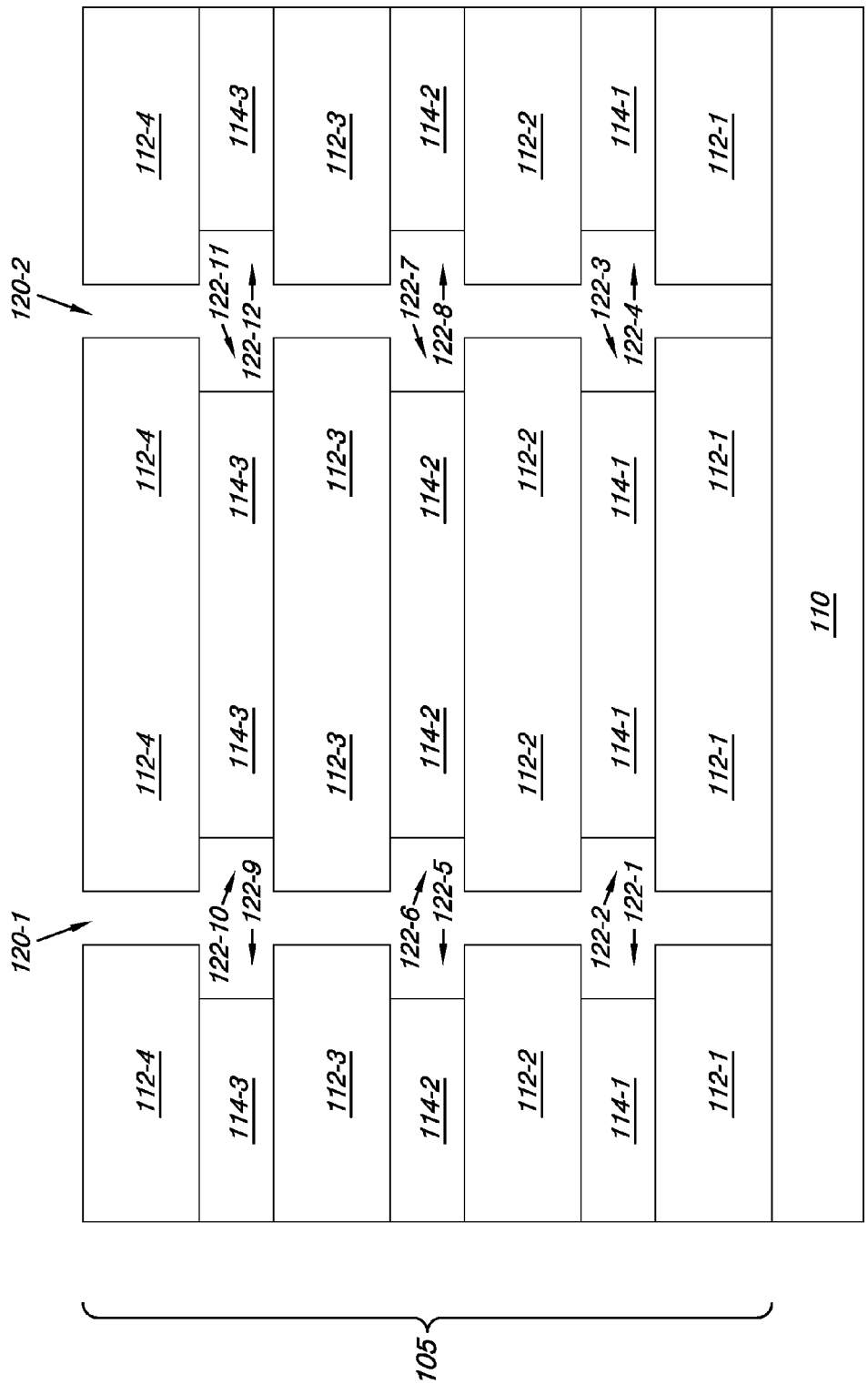

FIG. 1C illustrates a schematic cross-sectional view of the structure shown in FIG. 1B after a subsequent processing step. Portions of memory cell material 114-1 are removed, e.g., etched and/or patterned, to form recesses 122-1, 122-2, 122-3, and 122-4 in memory cell material 112-1 shown in FIG. 1C. Additionally, portions of memory cell material 114-2 are removed to form recesses 122-5, 122-6, 122-7, and 122-8 in memory cell material 114-2 shown in FIG. 1C. Additionally, portions of memory cell material 114-3 are removed to form recesses 122-9, 122-10, 122-11, and 122-12 in memory cell material 114-3 shown in FIG. 1C. Recesses 122-1, 122-2, 122-5, 122-6, 122-9, and 122-10 can be adjacent opening 120-1, and recesses 122-3, 122-4, 122-7, 122-8, 122-11, and 122-12 can be adjacent opening 120-2, as shown in FIG. 1C.

Recesses 122-1 through 122-4 can be formed by selectively removing portions of memory cell material 114-1, e.g., by removing portions of memory cell material 114-1 without removing any portion of insulator materials 112-1 through 112-4. Recesses 122-5 through 122-8 can be formed by selectively removing portions of memory cell material 114-2, e.g., by removing portions of memory cell material 114-2 without removing any portion of insulator materials 112-1 through 112-4. Recesses 122-9 through 122-12 can be formed by selectively removing portions of memory cell material 114-3, e.g., by removing portions of memory cell material 114-3 without removing any portion of insulator materials 112-1 through 112-4. The portions of memory cell material 114-1 through 114-3 that are selectively removed to form recesses 122-1 through 122-12 can be selectively removed with, for example, a selective wet etch that etches back the memory cell materials without etching the insulator materials.

Figure 1D:
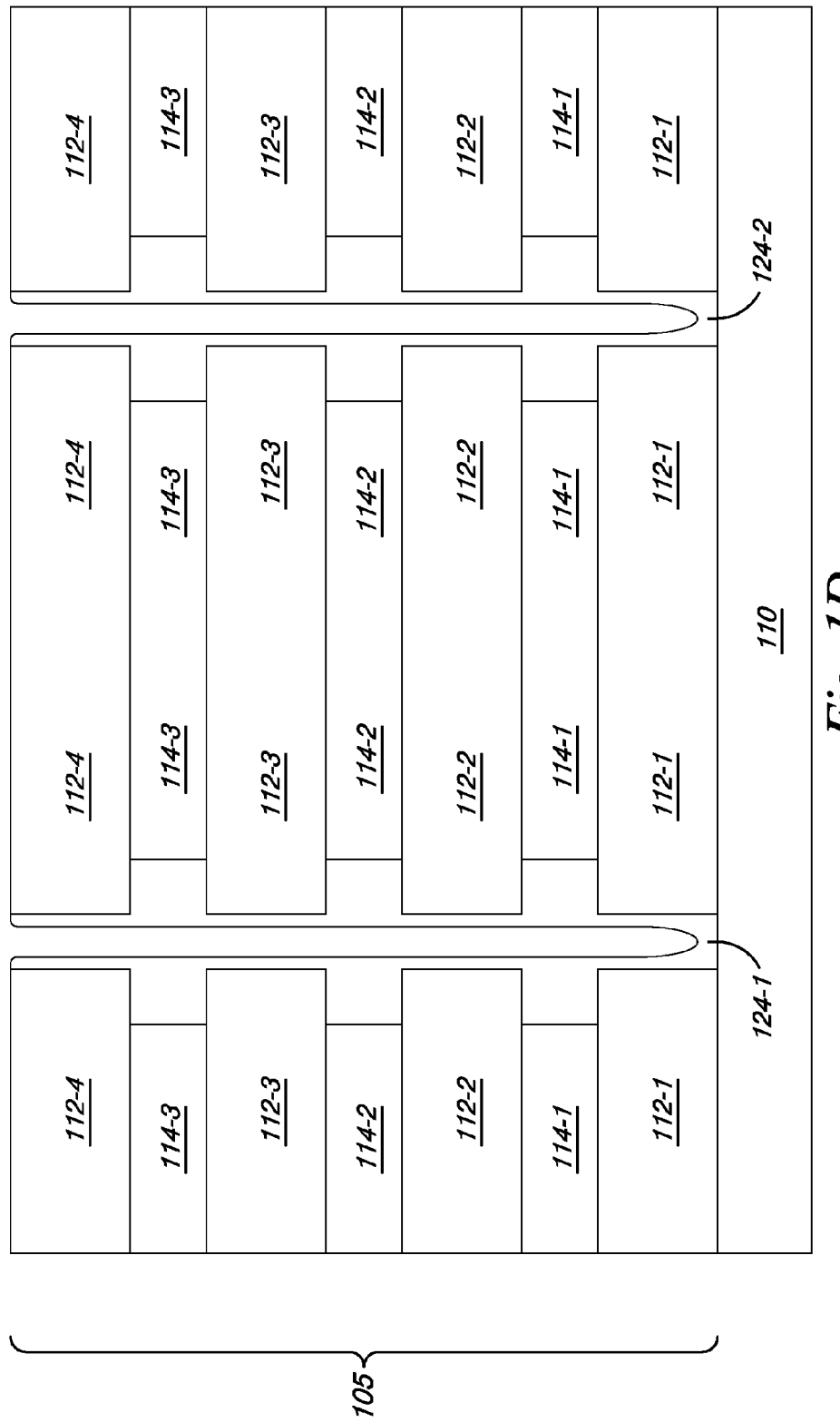

FIG. 1D illustrates a schematic cross-sectional view of the structure shown in FIG. 1C after a subsequent processing step. In FIG. 1D, electrode material 124-1 is formed in opening 120-1 and recesses 122-1, 122-2, 122-5, 122-6, 122-9, and 122-10. Additionally, electrode material 124-2 is formed in opening 120-2 and recesses 122-3, 122-4, 122-7, 122-8, 122-11, and 122-12. Electrode materials 124-1 and 124-2 can be, for example, a metal material, such as a tungsten or platinum material, among other metal materials.

In one or more embodiments, electrode material 124-1 can be conformally formed, e.g., conformally deposited, in opening 120-1 and recesses 122-1, 122-2, 122-5, 122-6, 122-9, and 122-10 such that electrode material 124-1 completely fills recesses 122-1, 122-2, 122-5, 122-6, 122-9, and 122-10, and partially fills opening 120-1, as shown in FIG. 1D. Additionally, electrode material 124-2 can be conformally formed, e.g., conformally deposited, in opening 120-2 and recesses 122-3, 122-4, 122-7, 122-8, 122-11, and 122-12 such that electrode material 124-2 completely fills recesses 122-3, 122-4, 122-7, 122-8, 122-11, and 122-12, and partially fills opening 120-2, as shown in FIG. 1D.

In one or more embodiments, recesses 122-1 through 122-12 may not be formed in memory cell materials 114-1 through 114-3. That is, one or more embodiments may not include the process step previously described in connection with FIG. 1C. In such embodiments, electrode material 124-1 can be selectively formed, e.g., selectively deposited, in opening 120-1 adjacent the sides of memory cell materials 114-1 through 114-3 that are adjacent opening 120-1. That is, electrode material 124-1 can be formed, e.g., deposited, in opening 120-1 adjacent the sides of memory cell materials 114-1 through 114-3 that are adjacent opening 120-1 without forming any electrode material 124-1 adjacent the sides of insulator materials 112-1 through 112-4 that are adjacent opening 120-1. Similarly, in such embodiments, electrode material 124-2 can be selectively formed in opening 120-2 adjacent the sides of memory cell materials 114-1 through 114-3 that are adjacent opening 120-2. That is, electrode material 124-2 can be formed in opening 120-2 adjacent the sides of memory cell materials 114-1 through 114-3 that are adjacent opening 120-2 without forming any electrode material 124-2 adjacent the sides of insulator materials 112-1 through 112-4 that are adjacent opening 120-2.

FIG. 1E illustrates a schematic cross-sectional view of the structure shown in FIG. 1D after a subsequent processing step. Portions of electrode materials 124-1 and 124-2 are removed, e.g., etched and/or patterned, from openings 120-1 and 120-2, respectively, as shown in FIG. 1E. The removed portions of electrode materials 124-1 and 124-2 can be removed, for example, by an anisotropic dry etch.

As shown in FIG. 1E, portions of electrode materials 124-1 and 124-2 can be removed such that no electrode material 124-1 or 124-2 remains in openings 120-1 or 120-2, respectively. However, electrode material 124-1 can remain in recesses 122-1, 122-2, 122-5, 122-6, 122-9, and 122-10, and electrode material 124-2 can remain in recesses 122-3, 122-4, 122-7, 122-8, 122-11, and 122-12. For example, recesses 122-1, 122-2, 122-5, 122-6, 122-9, and 122-10 can remain completely filled with electrode material 124-1, and recesses 122-3, 122-4, 122-7, 122-8, 122-11, and 122-12 can remain completely filled with electrode material 124-2, as shown in FIG. 1E. Additionally, a side of electrode material 124-1 in recesses 122-1, 122-2, 122-5, 122-6, 122-9, and 122-10 can be adjacent opening 120-1, and a side of electrode material 124-2 in recesses 122-3, 122-4, 122-7, 122-8, 122-11, and 122-12 can be adjacent opening 120-2, as shown in FIG. 1E.

The portions of electrode materials 124-1 and 124-2 that remain in recesses 122-1 through 122-12 can form lines, e.g., metal lines, that run parallel to the surface of vertical stack 105, e.g., into and out of the page, as shown in FIG. 1E. These lines can be, for example, data lines, e.g., bit lines. In embodiments in which recesses 122-1 through 122-12 are not formed, the electrode materials 124-1 and 124-2 that are selectively formed in openings 120-1 and 120-2, respectively, adjacent the sides of memory cell materials 114-1 through 114-3 that are adjacent openings 120-1 and 120-2, respectively, can form the lines.

FIG. 1F illustrates a schematic cross-sectional view of the structure shown in FIG. 1E after a subsequent processing step. In FIG. 1F, insulator material 126-1 is formed in opening 120-1, and insulator material 126-2 is formed in opening 120-2. Insulator materials 126-1 and 126-2 can be formed, e.g., deposited, in openings 120-1 and 120-2, respectively, in a number of ways, including physical vapor deposition (PVD), chemical vapor deposition (CVD), and/or atomic layer deposition (ALD).

As shown in FIG. 1F, insulator material 126-1 can be formed in opening 120-1 such that insulator material 126-1 is adjacent electrode material 124-1 and access device 110. Similarly, insulator material 126-2 can be formed in opening 120-2 such that insulator material 126-2 is adjacent electrode material 124-2 and access device 110. For example, insulator materials 126-1 and 126-2 can be formed in openings 120-1 and 120-2, respectively, such that insulator materials 126-1 and 126-2 completely fill openings 120-1 and 120-2, respectively, as shown in FIG. 1F.

Insulator materials 126-1 and 126-2 can be, for example, a dielectric material. Dielectric materials can include, for example, nitride dielectric materials, such as silicon nitride ($Si_3N_4$) dielectric materials, and oxide dielectric materials, such as silicon dioxide ($SiO_2$) dielectric materials. However, embodiments of the present disclosure are not limited to a particular type of insulator material. Further, insulator materials 126-1 and 126-2 can be the same material, e.g., the same dielectric material, as insulator materials 112-1 through 112-4. Alternatively, insulator materials 126-1 and 126-2 can be a different material than insulator materials 112-1 through 112-4.

FIG. 1G illustrates a schematic top view of the embodiment shown in FIG. 1F. In FIG. 1G, electrode materials, e.g., data lines, 124-1 and 124-2 are shown for ease of illustration. However, electrode materials 124-1 and 124-2 can run through vertical stack 105, e.g., underneath fourth insulator material 112-4, as previously described herein. As shown in FIG. 1G, electrode materials, e.g., data lines, 124-1 and 124-2 can run parallel to the surface of vertical stack 105.

FIG. 1H illustrates a schematic top view of the structure shown in FIG. 1G after a subsequent processing step. Portions of vertical stack 105 are removed, e.g., etched and/or patterned, to form openings 140-1, 140-2, 140-3, 140-4, 140-5, 140-6, 140-7, 140-8, and 140-9 in vertical stack 105 shown in FIG. 1H. One or more sides of electrode materials 124-1 and 124-2 can be adjacent openings 140-1 through 140-9, as shown in FIG. 1H. Further, although not shown in FIG. 1H, one or more sides of insulator materials 112-1 through 112-4 and memory cell materials 114-1 through 114-3 can be adjacent openings 144-1 through 144-12.

Openings 140-1 through 140-9 can be formed in vertical stack 105 in a number of ways. For example, openings 140-1 through 140-9 can be formed by etching through vertical stack 105 to access device 110 (not shown in FIG. 1H) such that the bottom of openings 140-1 through 140-9 are adjacent access device 110. Further, openings 140-1 through 140-9 can be formed in a single etch through vertical stack 105, or in a series of etches through vertical stack 105.

Figure 1I:
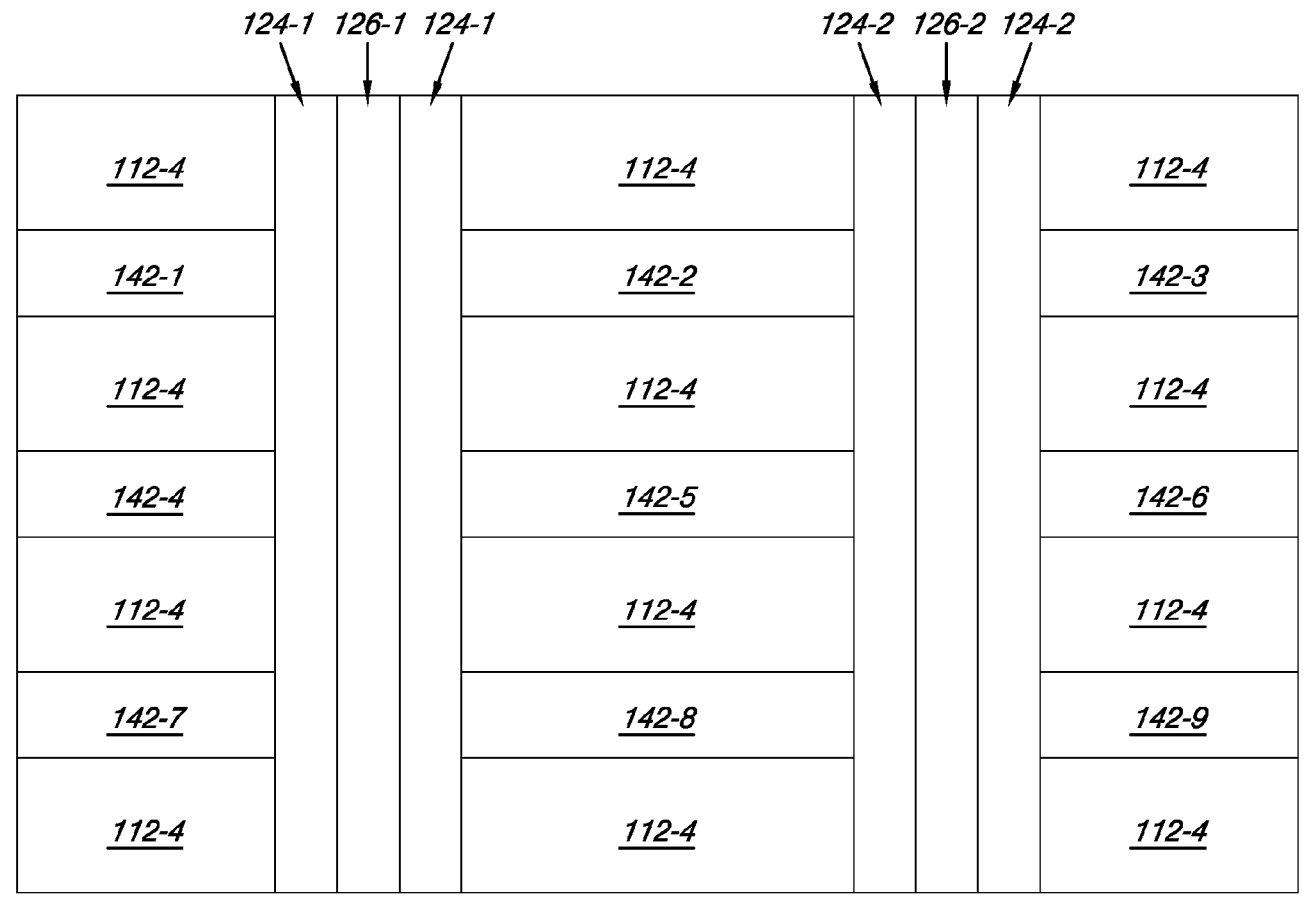

FIG. 1I illustrates a schematic top view of the structure shown in FIG. 1H after a subsequent processing step. In FIG. 1I, insulator material 142-1 is formed in opening 140-1, insulator material 142-2 is formed in opening 140-2, insulator material 142-3 is formed in opening 140-3, insulator material 142-4 is formed in opening 140-4, insulator material 142-5 is formed in opening 140-5, insulator material 142-6 is formed in opening 140-6, insulator material 142-7 is formed in opening 140-7, insulator material 142-8 is formed in opening 140-8, and insulator material 142-9 is formed in opening 140-9. Insulator materials 142-1 through 142-9 can be formed, e.g., deposited, in openings 140-1 through 140-9 in a number of ways, including physical vapor deposition (PVD), chemical vapor deposition (CVD), and/or atomic layer deposition (ALD).

As shown in FIG. 1I, insulator materials 142-1 through 142-9 can be formed in openings 140-1 through 140-9 such that insulator materials 142-1 through 142-9 are adjacent one or more sides of electrode materials 124-1 and 124-2. Further, although not shown in FIG. 1I, insulator materials 142-1 through 142-9 can be formed in openings 140-1 through 140-9 such that insulator materials 142-1 through 142-9 are adjacent one or more sides of insulator materials 112-1 through 112-4 and memory cell materials 114-1 through 114-3. For example, insulator materials 142-1 through 142-9 can be formed in openings 140-1 through 140-9 such that insulator materials 142-1 through 142-9 completely fill openings 140-1 through 140-9.

Insulator materials 142-1 through 142-9 can be, for example, a dielectric material. Dielectric materials can include, for example, nitride dielectric materials, such as silicon nitride ($Si_3N_4$) dielectric materials, and oxide dielectric materials, such as silicon dioxide ($SiO_2$) dielectric materials. However, embodiments of the present disclosure are not limited to a particular type of insulator material. Further, insulator materials 142-1 through 142-9 can be the same material, e.g., the same dielectric material, as insulator materials 112-1 through 112-4 and/or insulator materials 126-1 and 126-2. Alternatively, insulator materials 142-1 through 142-9 can be a different material than insulator materials 112-1 through 112-4 and/or insulator materials 126-1 and 126-2.

Figure 1J:
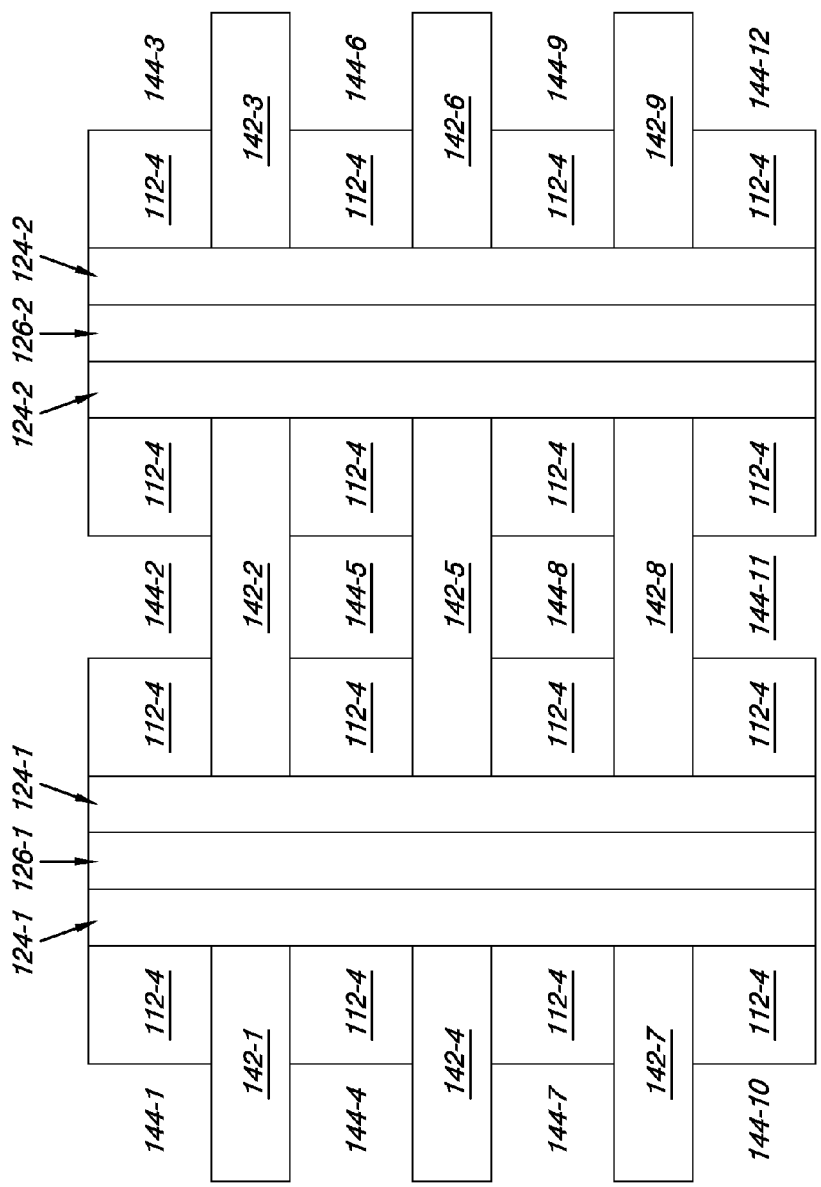

FIG. 1J illustrates a schematic top view of the structure shown in FIG. 1I after a subsequent processing step. Portions of vertical stack 105 are removed, e.g., etched and/or patterned, to form openings 144-1, 144-2, 144-3, 144-4, 144-5, 144-6, 144-7, 144-8, 144-9, 144-10, 144-11, and 144-12 in vertical stack 105 shown in FIG. 1J. Although not shown in FIG. 1J, one or more sides of insulator materials 112-1 through 112-4 and memory cell materials 114-1 through 114-3 can be adjacent openings 144-1 through 144-12.

Openings 144-1 through 144-12 can be formed in vertical stack 105 in a number of ways. For example, openings 144-1 through 144-12 can be formed by etching through vertical stack 105 to access device 110 (not shown in FIG. 1J) such that the bottom of openings 144-1 through 144-12 are adjacent access device 110. Further, openings 144-1 through 144-12 can be formed in a single etch through vertical stack 105, or in a series of etches through vertical stack 105.

Figure 1K:
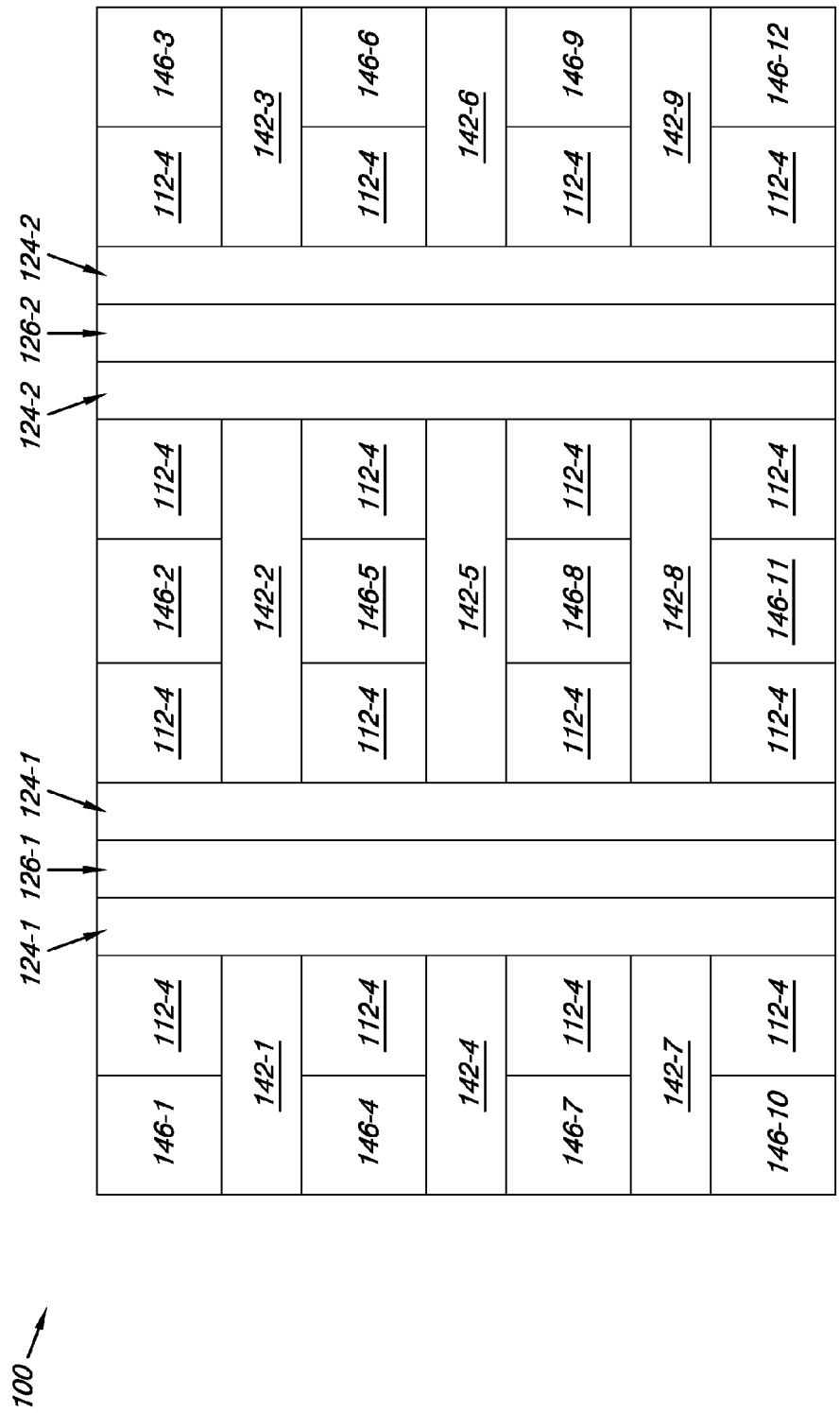

FIG. 1K illustrates a schematic tip view of the structure shown in FIG. 1J after a subsequent processing step. In FIG. 1K, electrode material 146-1 is formed in opening 144-1, electrode material 146-2 is formed in opening 144-2, electrode material 146-3 is formed in opening 144-3, electrode material 146-4 is formed in opening 144-4, electrode material 146-5 is formed in opening 144-5, electrode material 146-6 is formed in opening 144-6, electrode material 146-7 is formed in opening 144-7, electrode material 146-8 is formed in opening 144-8, electrode material 146-9 is formed in opening 144-9, electrode material 146-10 is formed in opening 144-10, electrode material 146-11 is formed in opening 144-11, and electrode material 146-12 is formed in opening 144-12. Electrode materials 146-1 through 146-12 can be formed, e.g., deposited, in openings 144-1 through 144-12 in a number of ways, including physical vapor deposition (PVD), chemical vapor deposition (CVD), and/or atomic layer deposition (ALD).

Electrode materials 146-1 through 146-12 can be, for example, a metal material, such as a tungsten or platinum material, among other metal materials. Electrode materials 146-1 through 146-12 can be the same material, e.g., the same metal material, as electrode materials 124-1 and 124-2. Alternatively, electrode materials 146-1 through 146-12 can be a different material than electrode materials 124-1 and 124-2.

Electrode materials 146-1 through 146-12 can also be, for example, access device contacts. That is, electrode materials 146-1 through 146-12 can be formed in openings 144-1 through 144-12 such that electrode materials 146-1 through 146-12 are in contact with access device 110 (not shown in FIG. 1J). Additionally, electrode materials 146-1 through 146-12 can be formed in openings 144-1 through 144-12 such that electrode materials 146-1 through 146-12 are adjacent one or more sides of insulator materials 112-1 through 112-4 and memory cell materials 114-1 through 114-3 (not shown in FIG. 1J).

The structure illustrated in FIG. 1K can be a portion of a memory device 100, such as a resistive memory device, for example. However, embodiments of the present disclosure are not limited to a particular type of memory device.

Figure 1L:
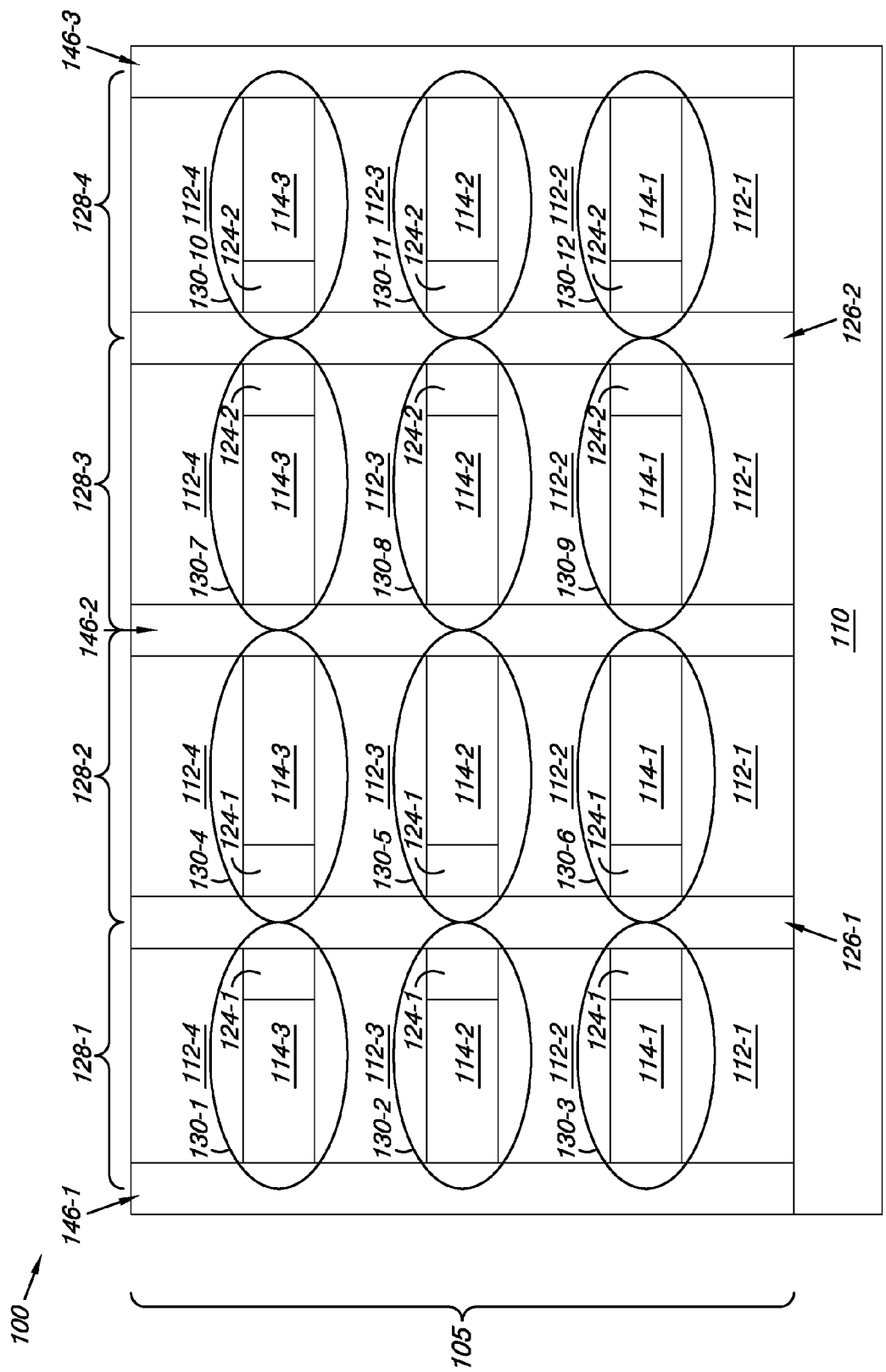

FIG. 1L illustrates a schematic cross-sectional view of the embodiment shown in FIG. 1K. As shown in FIG. 1L, electrode materials 146-1 through 146-3 are in contact with access device 110. Further, as shown in FIG. 1L, electrode materials 146-1 and 146-2 are adjacent a side of memory cell materials 114-1 through 114-3 that is opposite a side of memory cell materials 114-1 through 114-3 that is adjacent electrode material 124-1. Additionally, electrode materials 146-2 and 146-3 are adjacent a side of memory cell materials 114-1 through 114-3 that is opposite a side of memory cell materials 114-1 through 114-3 that is adjacent electrode material 124-2, as illustrated in FIG. 1L.

The structure illustrated in FIG. 1L includes vertical stacks 128-1, 128-2, 128-3, and 128-4 of self-aligned memory cells. As shown in FIG. 1L, vertical stack 128-1 includes self-aligned memory cells 130-1, 130-2, and 130-3, vertical stack 128-2 includes self-aligned memory cells 130-4, 130-5, and 130-6, vertical stack 128-3 includes self-aligned memory cells 130-7, 130-8, and 130-9, and vertical stack 128-4 includes self-aligned memory cells 130-10, 130-11, and 130-12. However, embodiments of the present disclosure are not limited to a particular number of vertical stacks, or to a particular number of memory cells in a vertical stack.

Each memory cell in vertical stacks 128-1 through 128-4 is horizontally oriented. That is, each memory cell can include a memory cell material, a first electrode, e.g., a portion of a first electrode material, adjacent a first side of the memory cell material, and a second electrode, e.g., a portion of a second electrode material, adjacent a second side of the memory cell material that is opposite the first side, as shown in FIG. 1L. A "side" of a memory cell material, as used herein, can be a surface of the memory cell material that is perpendicular to the top surface of access device 110. Each memory cell can also include an insulator material, e.g., a portion of an insulator material, adjacent the top and bottom of the memory cell material, as illustrated in FIG. 1H. A "top" and "bottom" of a memory cell material, as used herein, can be surfaces of the memory cell material that are parallel to the top surface of access device 110.

For example, as shown in FIG. 1L, memory cell 130-1 in vertical stack 128-1, memory cell 130-4 in vertical stack 128-2, memory cell 130-7 in vertical stack 128-3, and memory cell 130-10 in vertical stack 128-4 each include memory cell material 114-3, a portion of insulator material 112-4 adjacent the top of memory cell material 114-3, and a portion of insulator material 112-3 adjacent the bottom of memory cell material 114-3. Memory cell 130-1 further includes a portion of electrode material 146-1 adjacent a first side of memory cell material 114-3, and a portion of electrode material 124-1 adjacent a second, opposite side of memory cell material 114-3. Memory cell 130-4 further includes a portion of electrode material 146-2 adjacent a first side of memory cell material 114-3, and a portion of electrode material 124-1 adjacent a second, opposite side of memory cell material 114-3. Memory cell 130-7 further includes a portion of electrode material 146-2 adjacent a first side of memory cell material 114-3, and a portion of electrode material 124-2 adjacent a second, opposite side of memory cell material 114-3. Memory cell 130-10 further includes a portion of electrode material 146-3 adjacent a first side of memory cell material 114-3, and a portion of electrode material 124-2 adjacent a second, opposite side of memory cell material 114-3.

Additionally, a particular electrode, e.g., a portion of a particular electrode material, can be adjacent a first side of the memory cell material in each memory cell in a vertical stack. That is, the same electrode, e.g., a portion of the same electrode material, can be adjacent a first side of the memory cell material in each memory cell in a vertical stack. For example, as shown in FIG. 1L, a portion of electrode material 146-1 is adjacent a first side of the memory cell material in each memory cell 130-1 through 130-3 in vertical stack 128-1, and a portion of electrode material 146-3 is adjacent a first side of the memory cell material in each memory cell 130-10 through 130-12 in vertical stack 128-4.

Further, different electrodes, e.g., a portion of different electrode materials, can be adjacent a second side of the memory cell material in each memory cell in a vertical stack. For example, as shown in FIG. 1L, a portion of different electrode materials 124-1 are adjacent a second side of the memory cell material in each memory cell 130-1 through 130-3 in vertical stack 128-1, and a portion of different electrode materials 124-2 are adjacent a second side of the memory cell material in each memory cell 130-10 through 130-12 in vertical stack 128-4.

Additionally, a particular electrode, e.g., a portion of a particular electrode material, can be adjacent a first side of the memory cell material in each memory cell in adjacent vertical stacks. That is, the same electrode, e.g., a portion of the same electrode material, can be adjacent a first side of the memory cell material in each memory cell in adjacent vertical stacks. For example, as shown in FIG. 1L, a portion of electrode material 146-2 is adjacent a first side of the memory cell material in each memory cell 130-4 through 130-6 in vertical stack 128-2, and a portion of the same electrode material 146-2 is also adjacent a first side of the memory cell material in each memory cell 130-7 through 130-9 in vertical stack 128-3.

Further, different electrodes, e.g., a portion of different electrode materials, can be adjacent a first side of the memory cell material in each memory cell in adjacent vertical stacks. For example, as shown in FIG. 1L, a portion of electrode material 146-2 is adjacent a first side of the memory cell material in each memory cell 130-7 through 130-9 in vertical stack 128-3, and a portion of different electrode material 146-3 is adjacent a first side of the memory cell material in each memory cell 130-10 through 130-12 in vertical stack 128-4.

Additionally, adjacent vertical stacks, e.g., the memory cells in adjacent vertical stacks, can be separated by an insulator material. For example, as shown in FIG. 1L, vertical stacks 128-1 and 128-2, e.g., the memory cells in vertical stacks 128-1 and 128-2, are separated by insulator material 126-1, and vertical stacks 128-3 and 128-4, e.g., the memory cells in vertical stacks 128-3 and 128-4, are separated by insulator material 126-2.

Memory device 100 may include additional elements not shown in FIG. 1K or 1L so as not to obscure embodiments of the present disclosure. For example, memory device 100 may include an access line, e.g., word line, coupled to access device 110 and/or electrode materials 146-1 through 146-3. Additionally, memory device 100 may include sense circuitry coupled to electrode materials 124-1 and 124-2.

CONCLUSION

Horizontally oriented and vertically stacked memory cells are described herein. One or more method embodiments include forming a vertical stack having a first insulator material, a first memory cell material on the first insulator material, a second insulator material on the first memory cell material, a second memory cell material on the second insulator material, and a third insulator material on the second memory cell material, forming an electrode adjacent a first side of the first memory cell material and a first side of the second memory cell material, and forming an electrode adjacent a second side of the first memory cell material and a second side of the second memory cell material.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory device, comprising:
    at least two vertically stacked memory cells, wherein each of the memory cells include:
        a memory cell material having a recess formed therein;
        a first electrode in direct contact with a single first side of the memory cell material; and
        a second electrode in the recess and in direct contact with a single second side of the memory cell material.

2. The memory device of claim 1, wherein the single first side is opposite the single second side.

3. The memory device of claim 1, wherein the memory cells include an insulator material adjacent a top and a bottom of the memory cell material.

4. The memory device of claim 3, wherein the insulator material is a nitride dielectric material.

5. The memory device of claim 1, wherein the memory cells are self-aligned memory cells.

6. The memory device of claim 1, wherein the first electrode includes an access device contact.

7. The memory device of claim 1, wherein the second electrode includes a metal material.

8. A memory device, comprising:
    a first vertical stack of memory cells and a second vertical stack of memory cells, wherein each of the memory cells in the first and second vertical stacks include:
        a memory cell material having a recess formed therein;
        an access device contact in direct contact with a single first side of the memory cell material; and
        a metal material in the recess and in direct contact with a single second side of the memory cell material.

9. The memory device of claim 8, wherein the memory cell material in the memory cells in the first and second vertical stacks is adjacent an access device contact.

10. The memory device of claim 8, wherein:
    the memory cell material in the memory cells in the first vertical stack is adjacent a first access device contact; and
    the memory cell material in the memory cells in the second vertical stack is adjacent a second access device contact.

11. The memory device of claim 8, wherein the memory cells in the first vertical stack are separated from the memory cells in the second vertical stack by an insulator material.

12. The memory device of claim 11, wherein the insulator material is an oxide dielectric material.

13. The memory device of claim 8, wherein the first and second vertical stacks include:
    a first memory cell material;
    a second memory cell material above the first memory cell material;
    an access device contact adjacent a first side of the first memory cell material and a first side of the second memory cell material;
    a first metal material adjacent a second side of the first memory cell material; and
    a second metal material adjacent a second side of the second memory cell material.

14. A memory device, comprising:
    a first vertical stack of resistive memory cells and a second vertical stack of resistive memory cells, wherein each resistive memory cell in the first and second vertical stacks includes:
        a resistive memory cell material having a recess formed therein;
        an electrode in direct contact with a single first side of the resistive memory cell material; and an additional electrode in the recess and in direct contact with a single second side of the resistive memory cell material, wherein each resistive memory cell includes a portion of a different additional electrode.

15. The resistive memory device of claim 14, wherein the resistive memory cell material is phase change material.

16. The resistive memory device of claim 15, wherein the phase change material is a Germanium-Antimony-Tellurium material.

17. The resistive memory device of claim 14, wherein the resistive memory cell material is a resistive random access memory cell material.

18. The memory device of claim 14, wherein:
the electrode is an access device contact; and
the additional electrode is a metal line.

19. The memory device of claim 18, wherein the metal line is a data line.

* * * * *